Figure 1B:
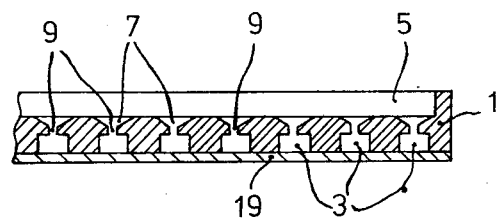

United States Patent [19]

Boehnke et al.

[11] 4,049,523
[45] Sept. 20, 1977

[54] METHOD OF AND DEVICE FOR PROVIDING THIN LAYERS BY CATHODE SPUTTERING

[75] Inventors: Ralf-Dieter Boehnke; Waldemar Götze, both of Hamburg, Germany

[73] Assignee: U.S. Philips Corporation, New York, N.Y.

[21] Appl. No.: 694,842

[22] Filed: June 10, 1976

[30] Foreign Application Priority Data

June 18, 1975 Germany .................. 2527184

[51] Int. Cl.² .................................................. C23C 15/00
[52] U.S. Cl. .................................. 204/192 R; 118/48; 204/298; 427/248 R
[58] Field of Search ........................ 204/192, 298; 427/248 R; 118/48

[56] References Cited

U.S. PATENT DOCUMENTS

| | | | |
|---|---|---|---|
| 3,464,907 | 9/1969 | Froemel et al. | 204/192 |
| 3,791,955 | 2/1974 | Klein | 204/298 |
| 3,976,555 | 8/1976 | Von Hartel | 204/192 |

OTHER PUBLICATIONS

A. Zozime et al., "Achievement of Isolated & Cooled Targets for a Cathodic Sputtering Device," *J. Phys. E. Sci. Inst.,* vol. 5, No. 5, May 1972, pp. 417–419.

*Primary Examiner*—John H. Mack
*Assistant Examiner*—Aaron Weisstuch
*Attorney, Agent, or Firm*—Frank R. Trifari; Norman N. Spain

[57] ABSTRACT

A mould and supporting dish for dry-compressed powder targets which are constructed so that adsorbed residual gases can readily escape during the evacuation process of the cathode sputtering device via substantially all the surfaces of the powder target, so that the powder target is not torn or its structure damaged during the evacuation process. The adsorbed residual gases can escape through apertures in the bottom and side wall of the supporting dish.

4 Claims, 5 Drawing Figures

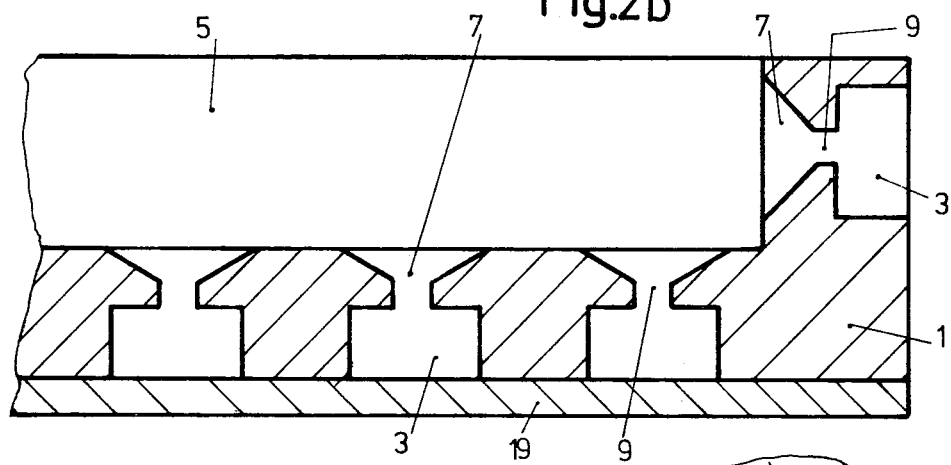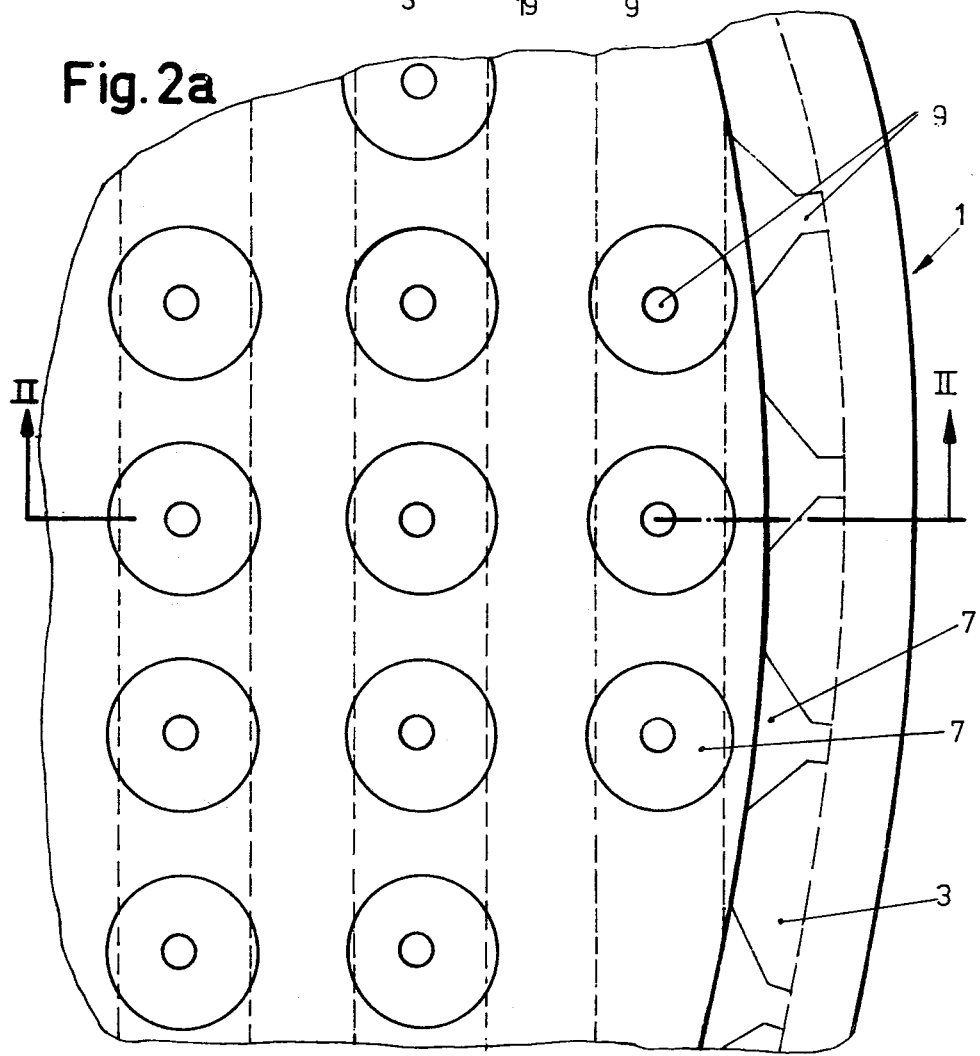

METHOD OF AND DEVICE FOR PROVIDING THIN LAYERS BY CATHODE SPUTTERING

The invention relates to a method of providing thin layers by cathode sputtering in a vacuum while using dry-compressed powder targets, and to a device for carrying out said method.

For the manufacture of thin layers on substrates by cathode sputtering, particles of atomic sizes are sputtered out of the target of the cathode (hereinafter termed target) by the impinging ions of an electric gas discharge maintained between a cathode and a counter electrode in a low-pressure atmosphere consisting of inert and possibly reactive gases, and are deposited on substrates arranged in the proximity of the counter electrode.

The target usually consists of the material which the layer to be formed is to consist of, example metal oxides, for the manufacture of thin ferromagnetic layers for integrated magnetic memories or of metals for the manufacture of thin metal layers, and for thin-layer resistors. In the manufacture of metal oxide layers, however, the starting material may also be a metallic target from which metal oxide layers are formed on the substrate by cathode sputtering in the presence of reactive gases, for example oxygen.

Targets may be solid metal plates but they may also be manufactured by means of the methods conventionally used in powder metallurgy in which bodies are compressed from powders and then sintered.

Furthermore it is known to dry-compress oxide or metal powders. In this case the mould at the same time serves as a supporting dish for the compressed powder target (British patent specification No. 1,184,428).

In order to remove residual gases, the sputtering chamber must be evacuated to a pressure in the range of approximately $2 \times 10^{-6}$ mbar prior to the beginning of sputtering. In this step of the method, targets dry-compressed from powders have the drawback that gases adsorbed in the intermediate spaces between the grains also escape and tear the compressed body of the target. Separate grains may be torn out of the compressed body and deposit in undesired places in the reaction space and afterwards adversely influence the quality of the layers to be manufactured. A further drawback due to the tearing of the powdered target occurs when parts of the metallic supporting dish in which the powder was compressed are exposed: in the subsequent cathode sputtering process, not only the metal or oxide parts of the compressed powder targets are sputtered but also parts of the supporting dish are sputtered, which results in contamination of the subsequently formed layer. These drawbacks may be removed is sintered or solid targets are used; however, since, targets of dry-compressed powders have great technological advantages — they are much cheaper to manufacture, enable shorter evacuation times for the reaction space, and can be sputtered more rapidly—it is the object of the invention to provide a method by which it is possible to use targets of dry-compressed powders without the above drawbacks.

According to the invention, this object is achieved in that gases adsorbed in the powder target are removed from the target via at least a porous bottom of the target during the evacuation of the cathode sputtering device. A device for carrying out the method according to the invention is characterized by a supporting dish for receiving the powder target, whose bottom surface and/or side surface have apertures extending normal to the surface.

With this device, the gases adsorbed in the powder target can escape in a defined manner and in small quantities via the large number of the ducts provided in the bottom surface and/or the side surface of the supporting dish without the construction of the compressed body being destroyed. In the construction of a supporting dish with apertures in the form of ducts, adsorbed gases can escape not only via the free upper side of the target but at least also via its bottom surface, that is via its major surfaces and via its side and bottom surfaces. Thus escape is possible via all outer surfaces and thus from substantially the whole surface of the target. No cracks are formed in the target and hence no metal of the supporting dish is exposed, nor do the escaping gases have a pressure high enough such that powder articles of the target are torn loose during the evacuation process and scatter.

Figure 1A:
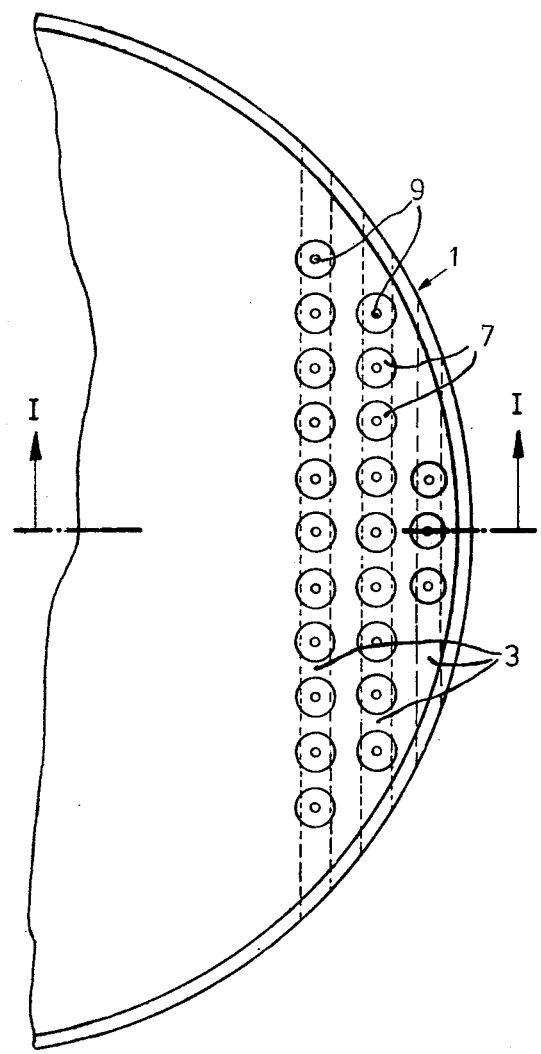

The invention will be described in greater detail with reference to the accompanying drawings, in which, FIG. 1a is a plan view of a first embodiment of a supporting dish according to the invention, FIG. 1b is a sectional view of a supporting dish according to the invention taken on the line I—I of FIG. 1a, FIG. 2a is a side elevation of a second embodiment of a supporting dish according to the invention (on an enlarged scale), FIG. 2b is a sectional view of a supporting dish shown in FIG. 2a taken on the line II—II of FIG. 2a (on an enlarged scale).

Figure 3:
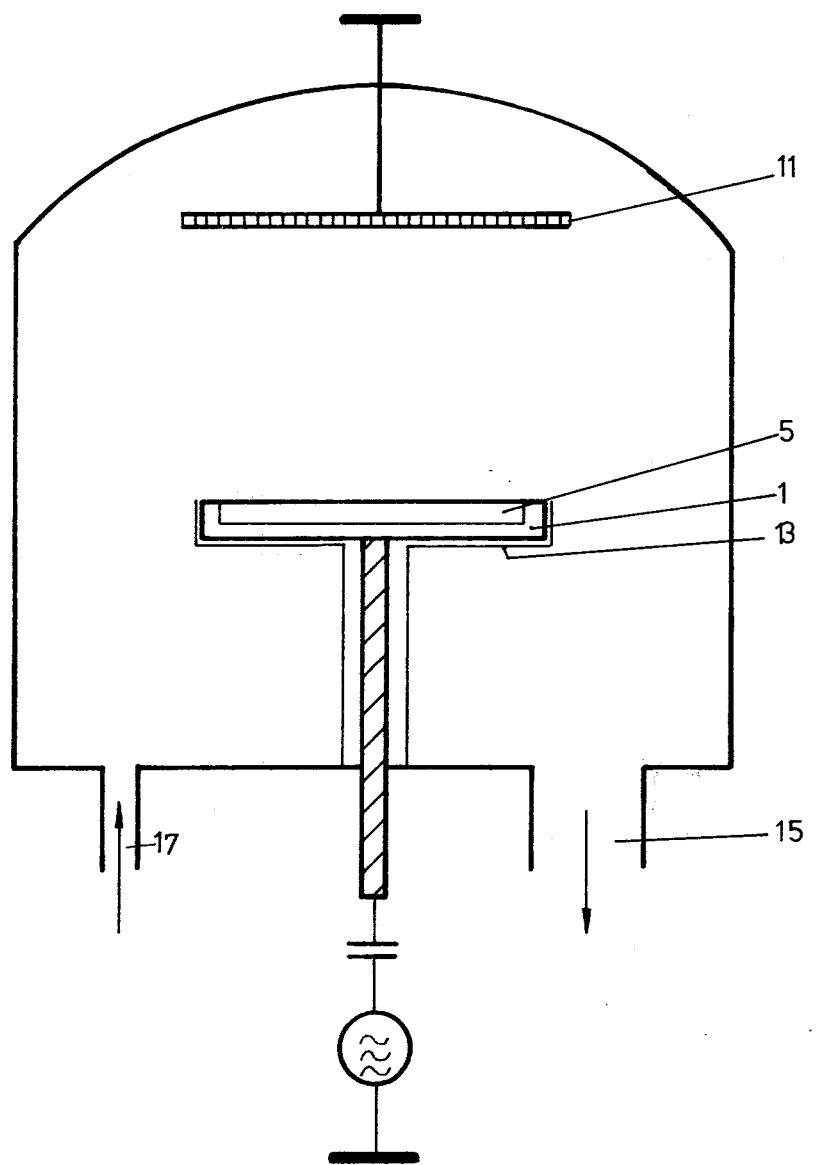

FIG. 3 is a schematic diagram of the arrangement of a target according to FIGS. 1a and 1b inside a vacuum space including the most important ducts.

The supporting dish 1 shown in FIGS. 1a and 1b comprises on its bottom surface remote from powder target 5 a large number of parallel extending ducts 3. A large number of apertures emerge from the ducts 3 and, on the side of the supporting dish 1 facing the powder target 5, are formed as funnels 7 which narrow into neck portions 9; the neck portions 9 represent the orifices of the funnels 7 in the duct 3. The centre angle of the funnel is approximately 120°. The funnel-like construction of the apertures has the advantage that the effective area for the exhaust of adsorbed gases is increased and that the neck portion 9 is not clogged with powder material upon filling the supporting dish 1 by the formation of a separate cone.

FIGS. 2a and 2b show a second embodiment for a supporting dish according to the invention: in this case the side walls of the supporting dish 1 for the powder target 5 are also provided with apertures in the form of funnels 7 having neck portions 9 which enable escape of the gases adsorbed in the powder target 5 from all sides of the target 5. This embodiment of the supporting dish 1 is particularly suitable for powder targets of larger thickness and in addition provides the advantage that the desired uniform structure of the powder target can be achieved in the extreme edge zones of the target.

Reference numerals correspond to the numbers used in FIGS. 1a and 1b.

Improved heat dissipation can advantageously be achieved if a cooling plate 19, for example of copper, is contacted with the lower side of the supporting dish 1.

Substrates, as they are conventionally used in thin-layer technology, so for example, of glass, ferrites or oxide ceramics, are provided with oxide layers, for example, layers of indium oxide, iron oxide, chromium oxide, tin oxide or aluminium oxide, in a device as shown in FIG. 3 having a counter electrode 11, a high frequency cathode 13, an exhaust tube 15 for evacuating the device, a gas supply duct 17 and leads for supplying the electrode voltage. As an example of substrates dimensions 30×30 mm were arranged at a distance of approximately 35 mm above the target 5 to be sputtered. The powder target 5 (diameter 170 mm, thickness 3 mm) was manufactured by compressing the oxide powders in the copper supporting dish 1 at a pressure of 8–16 N/sq.mm. The grain size of the compressed powders was in the range of maximum 10 $\mu$m, preferably $\leq$ 5 $\mu$m. The wall thickness of the supporting dish 1 was 1.5 mm with a diameter of approximately 180 mm, the bottom of the supporting dish 1 was 7 mm thick and had approximately 200 apertures distributed at uniform distances over the whole surface and extending into ducts 3, the centre angle of the funnel 7 facing the target was 120°; the duct 3 joining the neck-like continuation 9 of the funnel 7 had approximately the same width as the maximum diameter of the funnel 7. After producing a pressure of approximately $2 \times 10^{-6}$ mbar in the vacuum space by evacuation, sputtering was commenced under an argon atmosphere at a pressure of $5 \times 10^{-2}$ mbar. During and after the evacuation process the target had an undamaged surface.

What is claimed is:
1. In a method of providing thin layers on a substate by cathode sputtering from a compressed powder target in a vacuum, the improvement wherein any gases adsorbed in the compressed powder target are removed therefrom through surface pores including pores in the bottom surface of the target.
2. A method as claimed in claim 1, characterized in that gases adsorbed in the powder target are removed from the target via all outer surfaces of the target during the evacuation of the cathode sputtering device.
3. A supporting dish for supporting a compressed powder target, the bottom surface and side surfaces of said dish having apertures extending normal to the surfaces, in which the apertures on the surfaces adapted to face the target are formed as funnels which change into neck portions and emerge into parallel extending ducts which are provided on the surfaces of the supporting dish remote from the powder target.
4. The supporting dish of claim 3 consisting of an electrically conductive material.

* * * * *